United States Patent [19]

Baiocchi et al.

[11] Patent Number: 4,931,676
[45] Date of Patent: Jun. 5, 1990

[54] LOW-ABSORPTION CIRCUIT DEVICE FOR CONTROLLING A POWER TRANSISTOR INTO THE ON STATE

[75] Inventors: Antonella Baiocchi, Vigevano; Angelo Alzati, Bollate, both of Italy

[73] Assignee: SGS-Thomson Microelectronics S.R.L., Milano, Italy

[21] Appl. No.: 298,652

[22] Filed: Jan. 18, 1989

[30] Foreign Application Priority Data

Feb. 29, 1988 [IT] Italy .................. 19588 A/88

[51] Int. Cl.⁵ .............. H03K 17/687; H03K 3/01; G05F 3/16; H03F 3/45
[52] U.S. Cl. .................. 307/571; 307/270; 323/315; 330/257
[58] Field of Search .............. 307/571, 254, 296.1, 307/296.5, 296.7, 270; 323/312, 313, 314, 315, 316, 365; 330/257, 288, 296, 297

[56] References Cited

U.S. PATENT DOCUMENTS

| | | | |
|---|---|---|---|
| 3,496,441 | 2/1970 | Heider et al. | 323/365 |
| 3,805,093 | 4/1974 | Hodemaekers | 323/317 |
| 4,513,178 | 4/1985 | Hing et al. | 323/316 |
| 4,540,899 | 9/1985 | Pelly | 307/571 |
| 4,628,249 | 12/1986 | Ikefuji et al. | 323/316 |
| 4,689,607 | 8/1987 | Robinson | 323/315 |
| 4,697,154 | 9/1987 | Kousaka et al. | 323/315 |

FOREIGN PATENT DOCUMENTS 0272171  6/1988  European Pat. Off. ........... 307/571

OTHER PUBLICATIONS

Sun et al., "Modeling of the On–Resistance of LDMOS, VDMOS and VMOS Power Transistors", IEEE Transactions on Electron Device, vol. ED. 27, No. 2, Feb., 1980, pp. 356–367.

Primary Examiner—Stanley D. Miller
Assistant Examiner—Trong Q. Phan
Attorney, Agent, or Firm—Rosen, Dainow & Jacobs

[57] ABSTRACT

A low-absorption circuit device for controlling into the on state a power transistor, in particular a D MOS transistor having conventional gate, drain, and source electrodes, and adapted to drive electrical loads by changing over from an off state to an on state in which there appears on the gate electrode a predetermined voltage value, comprises a first turn-on circuit connected to one pole of a voltage supply, a second turn-on circuit connected to another supply voltage pole, and a comparator having respective inputs connected to the gate electrode of the power transistor and to a reference voltage pole as well as respective outputs connected to each respective turn-on circuit to activate said circuits alternately based on a comparison of the gate voltage of the power transistor with the predetermined reference voltage.

11 Claims, 1 Drawing Sheet

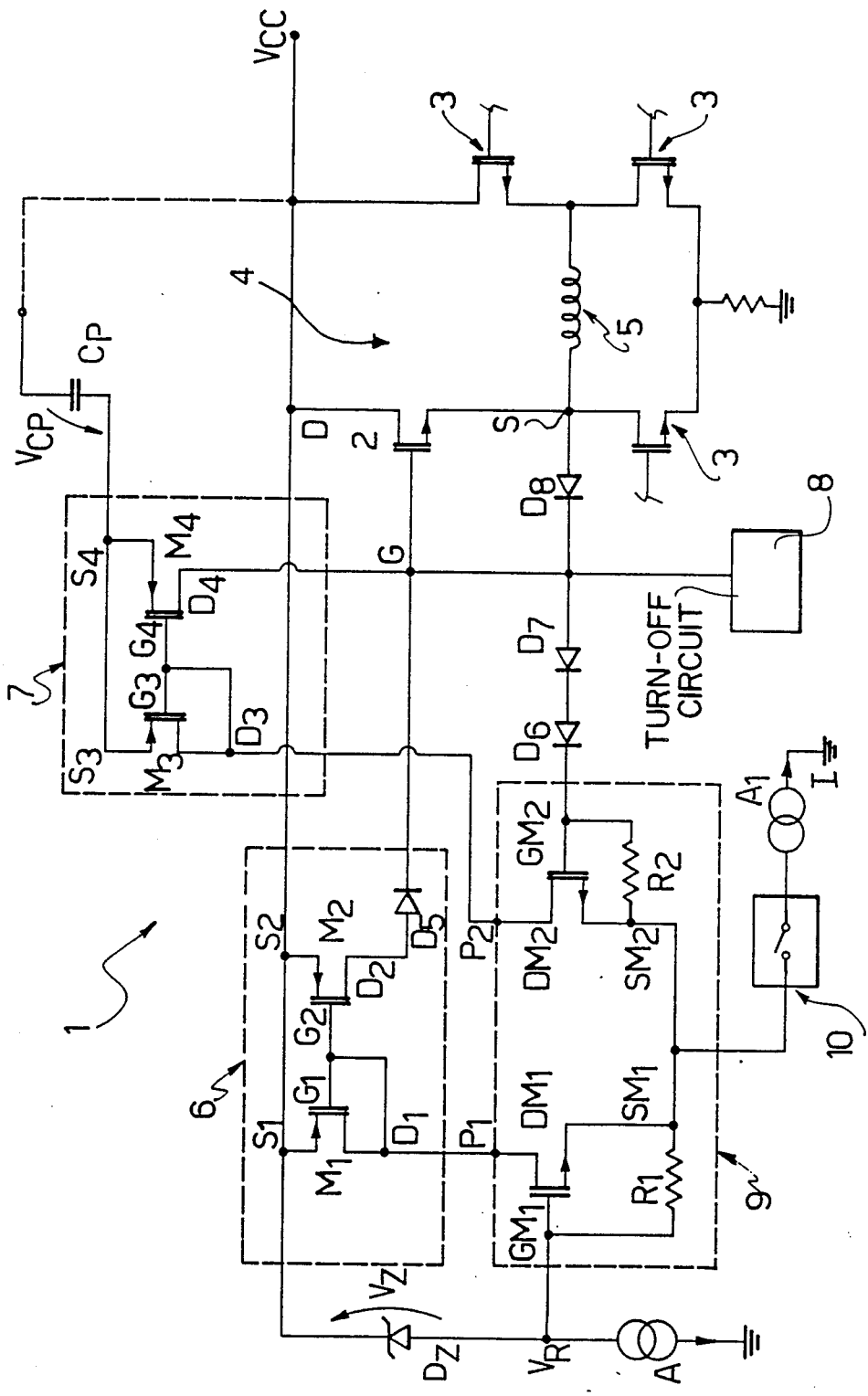

LOW-ABSORPTION CIRCUIT DEVICE FOR CONTROLLING A POWER TRANSISTOR INTO THE ON STATE

DESCRIPTION

This invention relates to a low-absorption circuit device for controlling a power transistor, in particular a D MOS transistor having conventional gate, drain, and source electrodes and being adapted for driving electrical loads by changing over from an off state to an on state in which a predetermined voltage value appears on the gate electrode.

BACKGROUND OF THE INVENTION

As is known, D MOS n-channel power transistors are currently extensively used as high-side drivers in bridge circuits to drive inductive loads. A DMOS n-channel power transistor is a double-diffused N-MOS transistor with a very short channel and a drift region between its channel and drain. See, for example, IEEE Transactions on Electron Devices, Vol. ED-19, No. 1, Jan. 1972.

Such bridge circuits have to be supplied electrically, in addition to a supply voltage Vcc, with a higher voltage Vcp than the supply voltage which is applied to the gate electrode on such power transistors in use as high-side drivers. This additional voltage value is specially needed under those conditions of operation when a power transistor delivers maximum current with a minimum voltage drop between its drain and source electrodes.

Furthermore, that voltage value is supplied to that transistor in the bridge circuit by means of a purposely provided turn-on circuit.

The voltage Vcp may be supplied by a feeder; however, where such a feeder is not available, said voltage value would be generated at one end of a so-called bootstrap capacitor Cp arranged to function as a charge storage. To that one end of the capacitor Cp, each turn-on circuit for each power transistor employed as a high-side driver in the bridge circuit is connected. The capacitor Cp is re-charged periodically by means of a re-charge circuit so as to keep the voltage value Vcp unchanged.

It is a current practice in the art to use, for each power transistor, a respective turn-on circuit which is input connected and powered directly from said capacitor, to which a plurality of power transistors from several possible bridge circuits may be connected.

That prior approach has drawbacks deriving from that, on changing over the power transistor from the off state to the on state, the achievement of a correct supply voltage value on the gates of such transistors is entirely demanded to said capacitor, which will exhibit a high absorption of charges. As a result, the use of large size capacitors and of a re-charge circuit of correspondingly large size becomes mandatory.

SUMMARY OF INVENTION

The technical problem that underlies this invention is to provide a circuit device for controlling power transistors to becoming conductive, which has such structural and performance characteristics as to minimize the absorption of charges by a capacitive supply source during the change-over phase from the off state to the on state, thus obviating the cited drawbacks with which the prior art is beset.

This problem is solved by a circuit device as indicated being characterized in that it comprises a first turn-on circuit connected to a first voltage supply pole, a second turn-on circuit input connected to a second voltage supply pole, a comparator having respective inputs connected to the gate electrode of the power transistor and to a reference voltage pole as well as respective outputs connected to each respective turn-on circuit.

The features and advantages of the device according to the invention will be more clearly understood by having reference to the following detailed description of an embodiment thereof, to be taken by way of illustration and not of limitation in conjunction with the accompanying drawing.

The drawing single FIGURE shows in schematic form a circuit device according to this invention.

With reference to the drawing view, the numeral 1 generally and schematically designates a low-absorption circuit device for controlling a power transistor 2 into the on state. The transistor 2 is, in this non-limitative embodiment, a D MOS n-channel power transistor type connected, together with other transistors 3 of the same type and functioning as a high-side driver, in a bridge circuit 4 for driving inductive electrical loads 5.

The transistor 2 is conventionally provided with gate G, drain D, and source S electrodes. The drain D is connected to one pole of a voltage supply Vcc, and a diode D8 is connected between the source S and the gate G.

The device 1 comprises a first turn-on circuit 6 having a transistor pair, respectively designated M1 and M2, of the p-channel MOS type with respective gate electrodes G1 and G2 interconnected and respective source electrodes S1 and S2 connected as inputs to the voltage supply Vcc pole.

The gate G1 and drain D1 of the transistor M1 are shorted to each other, the output of the turn-on circuit 6 being formed by the drain electrode D2 of the transistor M2 connected to the gate G of the power transistor 2 via a diode D5.

In accordance with this invention, a second turn-on circuit 7 is provided which also includes a transistor pair M3,M4 of the p-channel MOS type with respective gates G3 and G4 connected to each other.

The respective source electrodes S3 and S4 of those transistors M3 and M4 are connected to a second pole of the voltage supply Vcp present at one end of a so-called bootstrap capacitor Cp.

The gate G3 and drain D3 of the transistor M3 are shorted to each other, whilst the drain D4, forming the output of the second turn-on circuit 7, is connected directly to the gate G of the power transistor 2. That gate G is also connected to a turn-off circuit 8.

The construction of the circuit device 1 is completed by a comparator 9 comprising a transistor DM1 of the n-channel MOS type having as a first input thereof the gate electrode GM1 connected to ground via a current source A, and to the supply pole Vcc via a Zener diode DZ across which a voltage drop Vz appears. A resistor R1 interconnects the gate GM1 and source SM1 of the transistor DM1, whilst the drain P1 is connected with output functions for the comparator 9 to the drain D1 of the transistor M1 in the turn-on circuit 6.

The comparator 9 comprises a second transistor DM2 of the n-channel D MOS type having its drain P2 connected as a second output to the drain D3 of the transistor M3 in the second turn-on circuit 7. The transistor DM2 has its gate electrode GM2 connected as a second input to the gate G of the power transistor 2 via two serially connected diodes D6 and D7; in addition, the gate GM2 and source SM2 are connected to each other via a resistor R2.

The sources SM1 and SM2 of the transistors in the comparator 9 are connected together and to ground via a switch 10 and current source A1 connected in series.

The operation of the device 1 according to the invention will be described herein below with reference to an initial condition whereby the power transistor 2 is in an off state, with the gate electrode G at zero Volts, and the switch 10 then closes.

Under that condition, on the gate GM1 of the transistor DM1 there appears a voltage Vr resulting from the difference of the supply voltage Vcc less the voltage drop Vz across the Zener diode DZ.

This transistor DM1 is therefore conductive, and will activate the first turn-on circuit 6 to, in turn, drive the transistor 2 into the on state.

The circuit 6 will supply the gate G of the transistor 2 up to a voltage value given by the difference of the supply voltage Vcc minus the combined voltage drops between the source and the drain of the transistor M2 and across the diode D5.

To further increase the voltage on the gate G, the second turn-on circuit 7 cuts in at this point, being activated by the comparator 9 based on a comparison of the voltage values between its inputs GM1 and GM2. In particular, the circuit 7 becomes operative upon the voltage on the gate G, and hence, on the input GM2 exceeding a value given by the sum of the voltage Vr plus the voltage drops across the diodes D6 and D7. The latter voltage value may be adjusted by suitably selecting the Zener diode DZ, the objective being that of balancing the conflicting needs to minimize the absorption of charges by the capacitor CP and at the same time avoid slow-downs in the changeover phase due to saturation of the transistor M2.

The moment the circuit 7 is activated, all the current from the current source A1 will flow through the transistor DM2 and put the first circuit 6 out of conduction which is also cut off by the provision of the diode D5.

At the end of each change-over phase, the resistors R1 and R2 will restore the comparator 9 to a balance condition.

By using identical transistors DM1 and DM2, M1 and M3, M2 and M4 for the respective circuits 6, 7, 9, it becomes possible to obtain a continuous up curve for the gate G voltage, and a consequently similar waveform for the output voltage to be supplied to the inductive load 5.

The device of this invention affords a major advantage in that it can minimize the absorption of charges by the capacitor Cp, thus enabling the size of that capacitor to be reduced. This advantage also reflects in the possibility to reduce the size of the re-charge circuit provided to maintain the reference voltage value across said capacitor, or contingent on requirements, in the possibility to drive a number of bridge circuits at higher change-over rates.

In the circuit shown in the drawing, the other high-side transistor 3 connected to the Vcc pole is connected to a drive circuit of the invention the same as that illustrated for the transistor 2. The two power transistors 3 at the bottom of the bridge circuit 4, which are connected to ground or the low-side, are connected to low-side driver control circuits of a well-known type.

We claim:

1. A low absorption circuit for controlling a DMOS power transistor having gate, drain and source electrodes and connected for driving an electrical load when switched from an off state to an on state, said low absorption circuit comprising:
   (a) a first voltage supply means,
   (b) a second voltage supply means that has a higher voltage than that of the first voltage supply means,
   (c) a first turn-on circuit connected to the first voltage supply means for supplying a first turn-on voltage to the DMOS power transistor gate,
   (d) a second turn-on circuit connected to the second voltage supply means for supplying a second higher turn-on voltage to the DMOS power transistor gate,
   (e) a comparator having respective inputs connected to a reference voltage and to the DMOS power transistor gate and respective outputs connected to the first and second turn-on circuits.

2. A circuit according to claim 1, wherein said first turn-on circuit comprises first and second transistors having respective gate electrodes connected to each other and respective source electrodes connected to said first voltage supply means, the gate and drain electrodes of said first MOS transistor being connected to each other and to the comparator, the drain electrode of the second MOS transistor being connected to the gate of said DMOS power transistor.

3. A circuit according to claim 1, wherein said second turn-on circuit comprises first and second MOS transistors having respective gate electrodes connected to each other and respective source electrodes connected to said second voltage supply means, the gate and drain electrodes of said first MOS transistor being connected to each other and to the comparator, and the drain electrode of the second MOS transistor being connected to the gate of said DMOS power transistor.

4. A circuit according to the claim 1, wherein said comparator comprises first and second MOS transistors having respective source electrodes connected to each other, said first MOS transistor having its gate electrode connected to the reference voltage, said second MOS transistor having its gate electrode connected to the gate of said DMOS power transistor.

5. A circuit according to claim 4, wherein the gate electrode of said first MOS transistor is also connected to ground via a current source and to said first voltage supply means via a Zener diode.

6. A circuit according to claim 4, wherein the source electrodes of said first and second MOS transistors are grounded via a serially connected switch and current source.

7. A circuit for driving an electrical load, comprising:
   (a) a first voltage source providing a given voltage,
   (b) a second voltage source providing a voltage higher than said given voltage,
   (c) a DMOS power transistor having an off state and an on state and connected to said electrical load and said first voltage source for driving said electrical load when switched from its off state to its on state, said DMOS power transistor having gate, drain and source electrodes,
   (d) a low absorption circuit for switching the DMOS power transistor from its off to its on state, said low absorption circuit comprising:

(i) a reference voltage source,
(ii) a first turn-on circuit connected to the first voltage source and having an input and an output connected to the gate of the DMOS power transistor,
(iii) a second turn-on circuit connected to the second voltage source and having an input and an output connected to the gate of the DMOS power transistor,
(iv) means having outputs connected to the first turn-on circuit input and to the second turn-on circuit input and having inputs connected to the reference voltage source and to the gate of the DMOS power transistor and responsive to a differential voltage between the reference voltage and the DMOS gate voltage for first activating the first turn-on circuit to supply a first turn-on voltage to the DMOS gate and for next activating the second turn-on circuit to supply a second voltage to increase the turn-on voltage applied to the DMOS gate.

8. The circuit of claim 7, wherein the means of element (d)(iv) further comprises means for inactivating the first turn-on circuit when the second turn-on circuit becomes active.

9. The circuit of claim 7, wherein the means of element (d)(iv) comprises a comparator having first and second transistors, the first comparator transistor being connected to the first turn-on circuit input, the second comparator transistor being connected to the second turn-on circuit input.

10. The circuit of claim 7, wherein the second voltage source comprises a capacitor.

11. The circuit of claim 10, wherein the electrical load is an inductive load.

* * * * *